(12) United States Patent
Grupp et al.

(10) Patent No.: US 7,826,023 B2
(45) Date of Patent: Nov. 2, 2010

(54) DISPLAY CELL, IN PARTICULAR LIQUID CRYSTAL, OR PHOTOVOLTAIC CELL COMPRISING MEANS FOR CONNECTION TO AN ELECTRONIC CONTROL CIRCUIT

(75) Inventors: Joachim Grupp, Enges (CH); Rolf Klappert, Neuchatel (CH)

(73) Assignee: Asulab S.A., Marin (CH)

( * ) Notice: Subject to any disclaimer, the term of this patent is extended or adjusted under 35 U.S.C. 154(b) by 645 days.

(21) Appl. No.: 10/518,495

(22) PCT Filed: Jun. 17, 2003

(86) PCT No.: PCT/EP03/06376

§ 371 (c)(1),
(2), (4) Date: Dec. 20, 2004

(87) PCT Pub. No.: WO04/001495

PCT Pub. Date: Dec. 31, 2003

(65) Prior Publication Data

US 2005/0237445 A1 Oct. 27, 2005

(30) Foreign Application Priority Data

Jun. 21, 2002 (EP) ................................... 02077490

(51) Int. Cl.
*G02F 1/1345* (2006.01)
(52) U.S. Cl. ..................................... 349/149; 349/153
(58) Field of Classification Search ........................ None
See application file for complete search history.

(56) References Cited

U.S. PATENT DOCUMENTS

| 4,025,162 | A | 5/1977 | Yagi |
| 6,587,175 | B1 | 7/2003 | Ruedin et al. |
| 2001/0015788 | A1* | 8/2001 | Mandai et al. ............... 349/172 |
| 2001/0046021 | A1* | 11/2001 | Kozuka et al. ............... 349/150 |
| 2002/0008805 | A1* | 1/2002 | Kawakami et al. ............ 349/61 |
| 2002/0019069 | A1* | 2/2002 | Wada ........................... 438/69 |
| 2002/0051102 | A1* | 5/2002 | Kuroki et al. ................. 349/58 |

FOREIGN PATENT DOCUMENTS

| JP | 56075624 | 6/1981 |
| JP | 56168628 | 12/1981 |
| JP | 07249555 | 9/1995 |
| WO | WO 99/41638 | 8/1999 |

* cited by examiner

OTHER PUBLICATIONS

International Search Report, completed Sep. 30, 2003.

*Primary Examiner*—David Nelms
*Assistant Examiner*—Lucy P Chien
(74) *Attorney, Agent, or Firm*—Griffin & Szipl, P.C.

(57) ABSTRACT

An electro-optical display cell including: a transparent front substrate whose top surface forms the front face of the cell; a back substrate whose lower surface forms the back face of the cell; a sealing frame joining the front and back substrates and defining a volume for retaining an electro-optically or photo-electrically active medium; the front and back substrates including on faces opposite to each other at least one electrode, each connected by conductive paths to an electrical power or control circuit and defining lateral electric contact zones, wherein the conductive paths are each formed of a first part in contact with the electrodes at the level of the lateral electric contact zones, and a second part extending over the back surface, contact means arranged over the edge and/or the back of the cell forming the electrical junction between the first and second parts of the conductive paths.

26 Claims, 5 Drawing Sheets

DISPLAY CELL, IN PARTICULAR LIQUID CRYSTAL, OR PHOTOVOLTAIC CELL COMPRISING MEANS FOR CONNECTION TO AN ELECTRONIC CONTROL CIRCUIT

This is a National Phase Application in the United States of International Patent Application No. PCT/EP03/06376 filed Jun. 17, 2003, which claims priority on European Patent Application No. 02077490.7, filed Jun. 21, 2002. The entire disclosures of the above patent applications are hereby incorporated by reference.

FIELD OF THE INVENTION

The present invention concerns a display device defining a volume for retaining a fluid such as a liquid crystal, and more generally, a sensitive material capable of changing its physical properties, particularly its optical properties, via the application of a voltage, or its electrical properties, via stress or radiation. In particular, the present invention concerns a display device of this type including means for connecting it to an electronic control circuit.

BACKGROUND OF THE INVENTION

In its widest acceptance, a liquid crystal cell is essentially made up of a transparent front substrate and a back substrate that may also be transparent, or not transparent, these two substrates being joined and maintained at a constant distance from each other by a sealing frame, which defines a sealed volume for retaining the liquid crystal. Further, the front and back substrates each include, on their faces opposite each other, at least one electrode, these electrodes being intended to be connected to an electronic control circuit which, by the selective application of appropriate voltages to determined electrodes, enables the optical properties of the liquid crystals to be altered at the point of intersection of the electrodes concerned.

One constant problem in the field of manufacturing liquid crystal cells of the type described hereinbefore is raised by the connection means for setting up the electrical connection between the electrodes of the cell and the control circuit. One simple technique for accomplishing the electrical connection between the electrodes and the control circuit consists in staggering the substrates in relation to each other, so that one can access a flat part of the electrodes and thus easily form the connection on the surface thereby freed. However, such an arrangement of the substrates makes large-scale manufacture of the cells difficult, particular when the latter are circular, and it requires additional time-costly operations. The resulting cells are also of larger dimensions and thus difficult to house inside portable electronic objects of small dimensions such as a wristwatch.

Another solution to the aforementioned problem has been proposed by the Applicant in the International Patent Application published under no. WO 99/41638. There is known, in fact, from this Application, an electro-optical cell such as a liquid crystal cell, or an electrochemical photovoltaic cell, these cells each being formed of a transparent front substrate, a back substrate that may also be transparent or not, a sealing frame joining the two substrates and defining a volume for retaining, in a sealed manner, a photo-electrically or electro-optically active medium, the substrates including on their faces opposite each other at least one electrode. These cells differ in that their electrodes are partially flush with the edge of the substrate on which they are deposited to define lateral electrical contact zones at the level of which right-angled shaped parts are added, which advantageously allow the electrical contact to be transferred to the back face of the cells.

Owing to these features, it is no longer necessary to stagger the two substrates of a cell to be able to establish the electrical connection between the electrodes of the cell and its control circuit, such that these substrates can be identical and arranged one overlapping the other. This thus results in great cell manufacturing simplicity, and thus to a considerable reduction in their cost price. Moreover, the space requirement of the cells is reduced, which facilitates the assembly thereof particularly in a wristwatch.

The solution described hereinbefore has, however, one drawback. In fact, the electrical contact parts, made of metal or a metal alloy that conducts electricity, form discrete elements that have to be bonded one after the other by means of a conductive adhesive onto the edge of the cell, at locations where the electrodes are flush with the edge of the substrate on which they are deposited. Such a manufacturing method, while relatively simple to implement in the case of an electrochemical photovoltaic cell which only comprises two electrodes, proves much more complicated to use in the case of liquid crystal cells, which, when they are of the matrix type, can comprise several hundred electrodes and counter-electrodes, which must each time be associated with a transfer electrical contact part. Of course, the manufacturing method could be automated, but the number and precision with which the electrical contact parts ought to be added onto the edge of the cells would considerably increase the manufacturing costs of such cells.

In order to overcome this problem, Patent documents JP 56 075624 and JP 56 168628 are known, which both disclose liquid crystal cells on the edge and back face of which conductive paths are deposited by printing.

Owing to these features, the display cell substrates can have substantially equal dimensions and do not need to be staggered with respect to each other to allow the electrical connections to be established between the electrodes and the control circuit. Thus, if, for the same external dimensions, the active surface of a liquid crystal cell can be increased, the display resolution can be increased, i.e. a larger number of line and column electrodes can be provided, without the pixel aperture, and thus the reflectivity of the display cell, being altered. Conversely, the increase in the display cell active surface, with a constant number of line and column electrodes, can be exploited to increase the width of the electrodes and thus the pixel aperture, which has a favourable effect on the reflectivity of the display.

The results described hereinbefore are attained owing to the fact that the means for connecting the electrodes of a display cell to a control circuit are not formed by contact parts which have to be individually bonded, but by conductive paths which allow the electrical contacts formed by the electrodes of a cell to be transferred from the edge of the cell to the back edge of the cell, then, from there, around the back edge and onto the back of the cell, these conductive paths being formed on the edge and the back of the cell by any appropriate technique for depositing and etching conductive layers in order to achieve the desired dimensions and resolution.

It might, however, be feared that the conductive paths, which are deposited in the form of thin layers, exhibit problems of reliability and electrical conduction continuity at the place where they match the often sharp back edge of the cell. In fact, the thermal stresses that appear during the cell manufacturing process can tear the conductive paths at the edge of the back substrate of the cell. Likewise, a thin layer deposited around the back edge of the cell has low mechanical strength and can easily be scratched and interrupted when the cell is handled or when one wishes to mount it in the portable object for which it is intended.

It is an object of the present invention to overcome the aforementioned problems in addition to others by providing a display device, particularly a liquid crystal cell, comprising means for connecting its electrodes to an electronic control circuit which are both simple to manufacture and reliable.

SUMMARY OF THE INVENTION

The present invention therefore concerns an electro-optical display cell, in particular a liquid crystal display, or an electrochemical photovoltaic cell, including:

- at least one transparent front substrate whose top surface forms the front face of the cell;
- at least one back substrate that may also be transparent or not, whose lower surface forms the back face of the cell;
- a sealing frame joining the front and back substrates and defining a volume for retaining an electro-optically or photo-electrically active medium in a sealed manner;
- the front and back substrates including on their faces opposite to each other at least one electrode each, these electrodes being intended to be connected by conductive paths to an electrical power or control circuit and defining lateral electric contact zones, the cell being characterised in that the conductive paths are each formed of a first part in contact with the electrodes at the level of the lateral electric contact zones, and a second part extending over the back surface of the cell, contact means arranged continuously or discontinuously over the edge and/or the back of the cell forming the electrical junction between the first and second parts of the conductive paths.

According to a variant, the contact means take the form of discrete bumps.

Thanks to these characteristics, conductive bumps are arranged on at least a part of the back periphery of the cell, so as to replace the arrangement of conductive paths around the back edge of the cell by a lateral contact pad on the opposite faces of the conductive bump that is more reliable and more resistant from a mechanical point of view.

In its most general acceptance, the present invention concerns a cell comprising a stack of (n) individual cells (where n is a natural integer number greater than or equal to 2), each of the individual cells being defined by two substrates belonging thereto, or a cell including (n+1) superposed substrates (where n is an integer number greater than or equal to 1), these (n+1) substrates being joined in pairs by a sealing frame.

The present invention also concerns a multi-layered liquid crystal display cell comprising four superposed substrates joined in pairs by sealing frames which each define a sealed cavity for retaining liquid crystals, a first sealing frame joining the first and second substrates, whereas a second sealing frame joins the second and third substrates and a third sealing frame joins the third and fourth substrates, the substrates including on their faces opposite each other at least one electrode each, the electrodes being intended to be connected by conductive paths to an electrical control circuit and defining lateral electric contact zones, This cell being characterised in that the conductive paths extend continuously from the lateral electric contact zones to the back of the cell.

In accordance with particular embodiments of the present invention, a first embodiment of an electro-optical display cell (1; 18), particularly a liquid crystal cell, or electrochemical photovoltaic cell includes: (a) at least one transparent front substrate (2; 22) whose top surface forms the front face (14) of the cell (1; 18); (b) at least one back substrate (8; 20) that may also be transparent or not, whose lower surface (12; 31) forms the back face of the cell (1; 18); (c) a sealing frame (36) joining the front (22) and back (20) substrates and defining a volume (38) for retaining an electro-optically or photo-electrically active medium in a sealed manner; the front (22) and back (20) substrates including on their faces opposite each other at least one electrode (24, 26) each, these electrodes (24, 26) being intended to be connected by conductive paths (16; 30, 34) to an electrical power or control circuit (10; 56) and defining lateral electric contact zones (28, 32), the cell being characterised in that the conductive paths (30, 34) are each formed of a first part (30a, 34a) in contact with the electrodes at the level of the lateral electric contact zones (28, 32), and a second part (30b, 34b) extending over the back surface (31) of the cell (18), contact means (42) arranged continuously or discontinuously over the edge (27) and/or the back (12; 31) of the cell (1; 18) forming the electrical junction between the first (30a, 34a) and second parts (30b, 34b) of the conductive paths (30, 34).

In accordance with a second embodiment, the first embodiment is modified so that the contact means (42) take the form of discrete bumps. In accordance with a third embodiment of the invention, the second embodiment is further modified so that the first parts (30a, 34a) of the conductive paths (30, 34) come into lateral contact with the conductive bumps (42), whereas the second parts (30b, 34b) of the conductive paths (30, 34) can extend as far as the top of the bumps (42) and cover them in whole or in part. In accordance with a fourth embodiment of the invention, the second embodiment is further modified so that the second parts (30b, 34b) of the conductive paths extend at least partially underneath the conductive bumps (42).

In accordance with a fifth embodiment of the invention, the first embodiment is modified so that the contact means (42) take the form of a tape of anisotropic conductive material (64). In accordance with a sixth embodiment of the invention, the first through fifth embodiments are modified so that they include a stack of (n) individual cells, each of the individual cells being defined by two substrates belonging thereto. In accordance with a seventh embodiment of the invention, the first through fifth embodiments are modified so they include (n+1) superposed substrates, these (n+1) substrates being joined in pairs by a sealing frame.

In accordance with an eighth embodiment of the invention, a multi-layered liquid crystal display cell (1) is provided that includes four superposed substrates (2, 4, 6, 8) joined in pairs by sealing frames which each define a sealed cavity for retaining liquid crystals, a first sealing frame joining the substrates (2, 4), while a second sealing frame joins the substrates (4, 6) and a third sealing frame joins the substrates (6, 8), wherein the substrates (2, 4, 6, 8) include on their faces opposite each other at least one electrode each, the electrodes being intended to be connected by conductive paths (30, 34) to an electric control circuit (10) and defining lateral electric contact zones, wherein the cell is characterised in that the conductive paths (30, 34) are each made up of a first part (30a, 34a) in contact with the electrodes at the level of the lateral electric contact zones (28, 32), and a second part (30b, 34b) extending over the back surface (31) of the cell (18), contact means (42) arranged continuously or discontinuously on the edge (27) and/or on the back (12; 31) of the cell (1; 18) forming the electric junction between the first (30a, 34a) and the second parts (30b, 34b) of the conductive paths (30, 34).

In accordance with a ninth embodiment of the invention, the first through eighth embodiments are modified so that the power or control circuit (10; 56) is mounted on the back (12;

31) of the cell (1; 18). In accordance with a tenth embodiment of the invention, the ninth embodiment is further modified so that the circuit (10; 56) is mounted directly on the back (12; 31) of the cell (1; 18). In accordance with an eleventh embodiment of the invention, the ninth embodiment is further modified so that the circuit (10; 56) is mounted on the back (12; 31) of the cell (1; 18) via a printed circuit board (60) or a flexible conductive film (61). In accordance with a twelfth embodiment of the present invention, the first to eleventh embodiments are further modified so that a transparent or coloured absorbent layer (62) for relaxing thermo-mechanical stresses and able to resist a chemical etch bath is deposited on the back of the cell (18).

In accordance with a thirteenth embodiment of the present invention, a method of metallising a group of liquid crystal cells is provided wherein the method includes the steps of: (a) metallising the back (12; 31) of the cells (1; 18) while the latter are still in batches; (b) separating the cells (1; 18) in individual cells; (c) arranging the group of cells (1; 18) on a support or fitting (48) so that the cells (1; 18) are arranged parallel to each other obliquely and staggered in relation to each other, and (d) depositing via evaporation an electrically conductive material on the edge (52) of the cells to be metallised.

BRIEF DESCRIPTION OF THE DRAWINGS

Other features and advantages of the present invention will appear more clearly from the following detailed description of an embodiment of a cell according to the invention, this example being given solely by way of non-limiting illustration, in conjunction with the annexed drawing, in which.

DETAILED DESCRIPTION OF THE INVENTION

The present invention will be described with reference to a liquid crystal display cell. It goes without saying that the present invention is not limited to such a type of cell, and that it could apply to any type of cell including a sensitive medium capable of changing its physical properties, particularly its optical properties via application of a voltage, or its electrical properties via stress or radiation. In particular, the present invention applies to an electrochemical photovoltaic cell such as that described in International Patent Application No. WO 99/41638 in the name of the Applicant, and as described in corresponding U.S. Pat. No. 6,587,175, wherein U.S. Pat. No. 6,587,175 is incorporated herein by reference.

Figure 1:
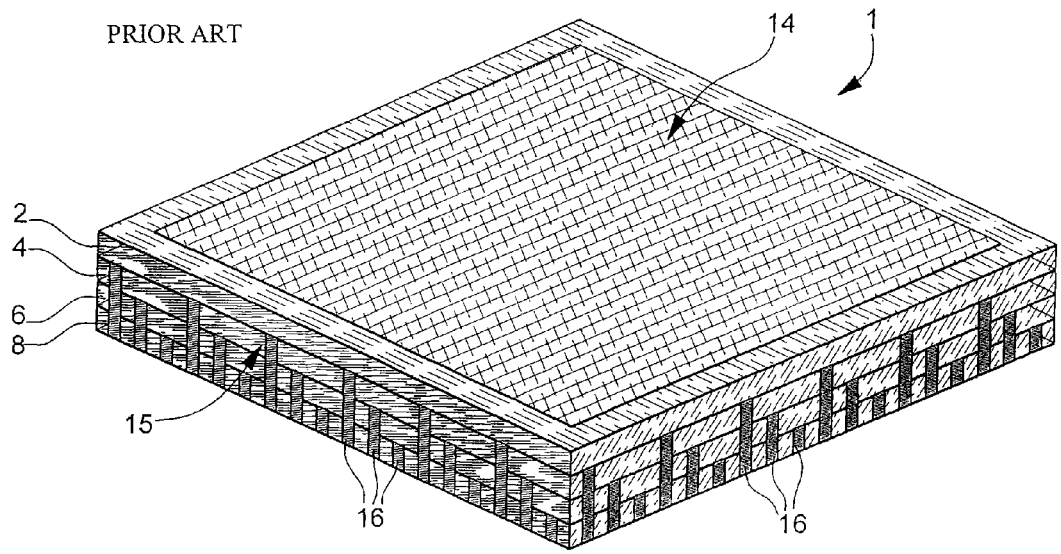
FIG. 1 is a general perspective view of a prior art multi-layered liquid crystal display cell.
Figure 2:
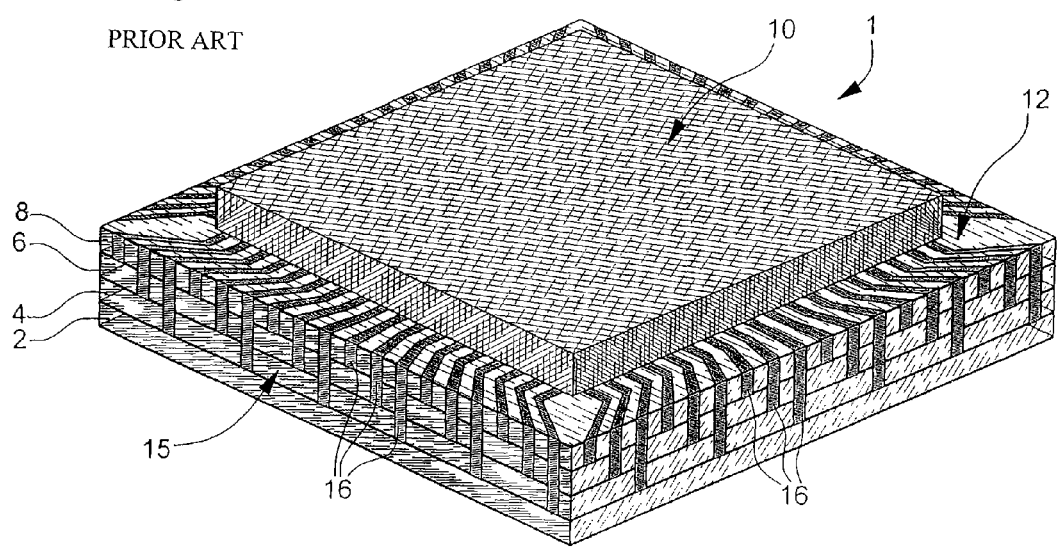
FIG. 2 is a general perspective view of the other side of the prior art multi-layered cell shown in FIG. 1.

FIGS. 1 and 2 are perspective views, respectively of the front and back of a prior art multi-layered liquid crystal display cell. Designated as a whole by the general reference numeral 1, this display cell includes four superposed substrates 2, 4, 6 and 8, which may be made of glass or any other transparent material, such as plastic. It will be noted that the last substrate 8 may or may not be transparent, depending upon the reflecting or transmitting nature of display cell 1. In the present case, since an integrated display control circuit 10 is mounted on the back 12 of the cell 1 (see FIG. 2), this is a reflective type cell and the back substrate 8 could be opaque or coated with an opacifier material in order to conceal or mask integrated circuit 10 from the view of an observer situated on the front side 14 of cell 1.

Substrates 2 to 8 are joined in pairs by sealing frames (not visible in FIGS. 1 and 2) which each define a sealed cavity for retaining liquid crystals. More specifically, a first sealing frame joins substrates 2 and 4, whereas a second sealing frame joins substrates 4 and 6 and a third and final sealing frame joins substrates 6 and 8.

As will appear more clearly in the following description, the electrodes of cell 1 are flush with the edge 15 of cell 1 at distinct locations on its perimeter to define thereon lateral electric contact zones. Conductive paths 16 which come into contact with the electrodes at the lateral electric contact zones are formed directly on the edge 15 and the back 12 of cell 1, so as to transfer all of the electrical contacts onto the same back plane of the cell 1. Conductive paths 16 thus extend from the electrodes of cell 1 as far as the input port of integrated display control circuit 10 which is mounted on the back 12 of cell 1 via techniques that will be described in detail hereinafter. In FIGS. 1 and 2, it can be seen that the conductive paths are not of equal lengths and stop just at the locations where the electrodes are flush with the edge of the cell. It goes without saying that the conductive paths have been shown in order to facilitate comprehension of how the electrical connections are established between the electrodes and the conductive paths, but that, in practice, it is preferable to make conductive paths of equal lengths.

It is thus unnecessary to stagger the substrates of one cell in order to access the electrodes of the latter and establish the electrical connections with a power or control circuit. Thus, this peripheral surface, which is normally reserved for connecting the cell and which, proportionally, overlaps further onto the active surface of the cell, the smaller the cell is, can be omitted. This proves particularly advantageous when, for the same active surface of the cell, the number of line and column electrodes increases. In fact, in such case, the width of the electrodes decreases, and in order to keep the surface of the electrical contact pads constant, the electrodes would have to be lengthened, which would have the effect of increasing the non-active zone around the display cell.

Omitting the peripheral zone normally reserved for addressing a liquid crystal display cell not only allows the aspect ratio, between the active zones and non-active zones of such a cell to be improved. It also gets rid of a complex and cumbersome system of flexible printed circuits that are usually bonded onto the periphery of the cell and which connects the various control circuits that they carry to the electrodes of the cell.

Until now, a cell with several layers has been described, solely for the purpose of making it clear that the invention is not limited to cells including a single active layer, for example of liquid crystals. Nonetheless, for the sake of clarity, reference will be made hereinafter to a display cell including only two substrates which enclose between them a single liquid crystal layer.

Figure 3:
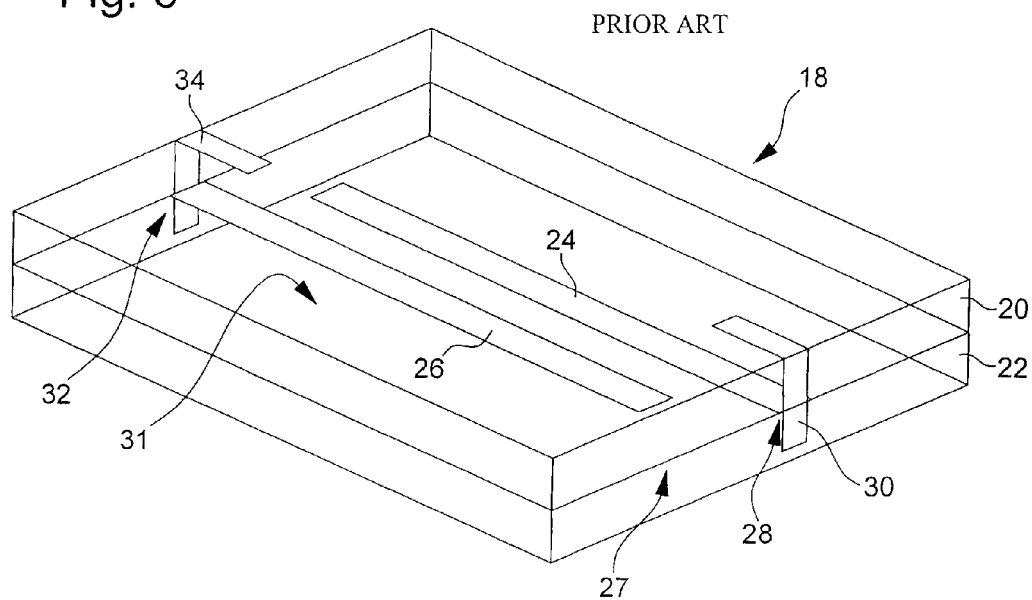
FIG. 3 is a schematic, perspective and transparent view of a prior art liquid crystal display cell including two substrates.

FIG. 3 is a schematic, perspective and transparent diagram of a prior art liquid crystal cell 18 including two substrates 20 and 22, which can be made of glass or any other transparent material such as plastic. Substrates 20 and 22 are joined to each other by a sealing frame (see FIG. 4 and following), which defines a sealed volume for retaining liquid crystals. Only two electrodes 24 and 26 have been shown in the drawing. It goes without saying, however, that in reality cell 18 includes a multiplicity of electrodes which are formed on the faces of substrates 20 and 22 which face each other. As can be seen, electrode 24 extends substantially over the total length of substrate 20 on which it has been deposited and at one of its ends, it is flush with edge 27 of the substrate 20 to define there a lateral electric contact zone 28. A conductive path 30 which is formed on edge 27 and on back 31 of cell 18 comes into contact with electrode 24 in contact zone 28, so as to transfer the electrical contact onto the back plane of the cell 18. The same is true of electrode 26, which defines a contact zone 32 where a conductive path 34 is formed.

Figure 4:
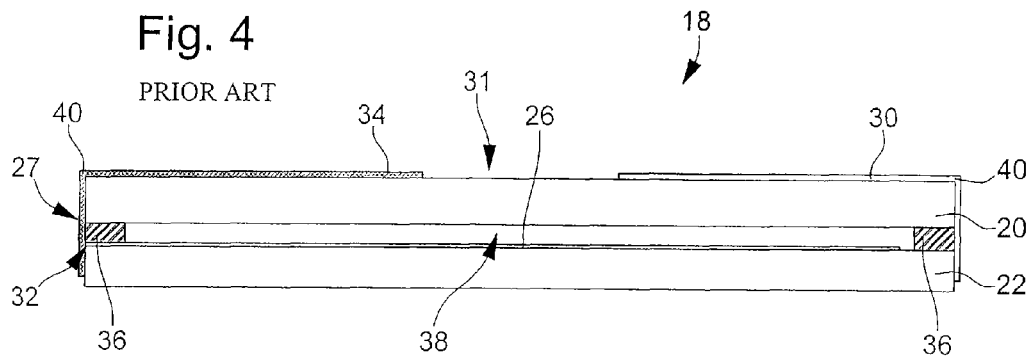
FIG. 4 is a longitudinal cross-section of the prior art display cell shown in FIG. 3.

FIG. 4 is a longitudinal cross-section of the prior art liquid crystal cell 18 shown in FIG. 3. This Figure shows sealing frame 36, which defines volume 38 for retaining the liquid crystal. Electrodes 24 and 26 pass underneath sealing frame 36 and are flush with edge 27 of substrate 20 on which they were formed to define the lateral electric contact zones respectively 28 and 32. Conductive paths 30 and 34 allow the electrical contacts formed by electrodes 24 and 26 of liquid crystal cell 18 to be moved from edge 27 of cell 18 to the edge or back rim 40 of the cell, then, from there, around the back edge 40 and to back 31 of cell 18.

Conductive paths 30 and 34 are formed by depositing thin layers of an electrically conductive material as will be described in detail hereinafter. Consequently, one might fear that the conductive paths exhibit problems of resistance to heat and to mechanical stresses and might tear at the places where they match the often sharp back edge 40 of the cell during manufacture of the cell or when it is handled. This is why, according to the embodiment illustrated in FIGS. 5 and 6, conductive bumps 42 (i.e., contact means or contact members) are formed along back edge 40 of the cell to ensure the continuity of conductive paths 30 and 34.

Figure 5:
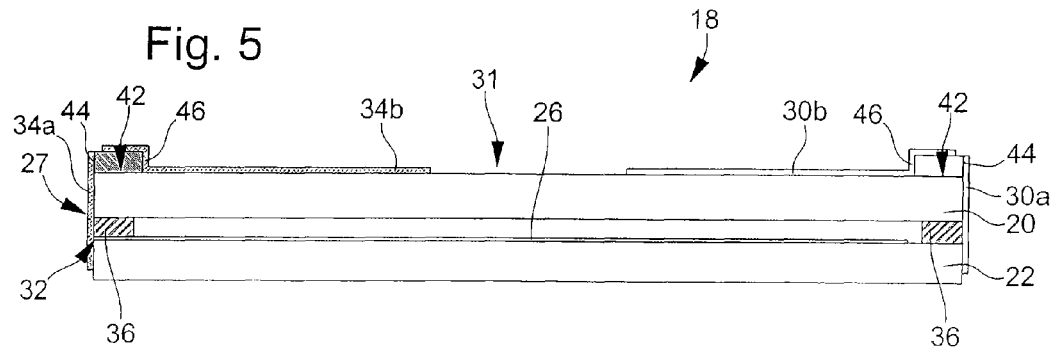
FIG. 5 is a cross-section of a liquid crystal display cell according to the invention.

Indeed, as is visible in FIG. 5, which illustrates an embodiment in accordance with the present invention, conductive paths 30 and 34 are each made up of a first part, respectively 30a and 34a, which extends over at least part of edge 27 of cell 18, and a second part, respectively 30b and 34b, which extends over at least a part of back 31 of cell 18, conductive bumps 42 forming the electric junction between the first ands second parts of the conductive paths 30 and 34. More specifically, the first parts 30a and 34a of conductive paths 30 and 34 come into contact laterally with conductive bumps 42, whereas the second parts 30b and 34b of the conductive paths 30 and 34 can extend as far as the top of the bumps 42 and even cover them partially. Consequently, the arrangement of conductive paths 30 and 34 around back edge 40 of cell 18 is replaced by lateral contact on opposite faces 44 and 46 of conductive bumps 42.

Figure 6:
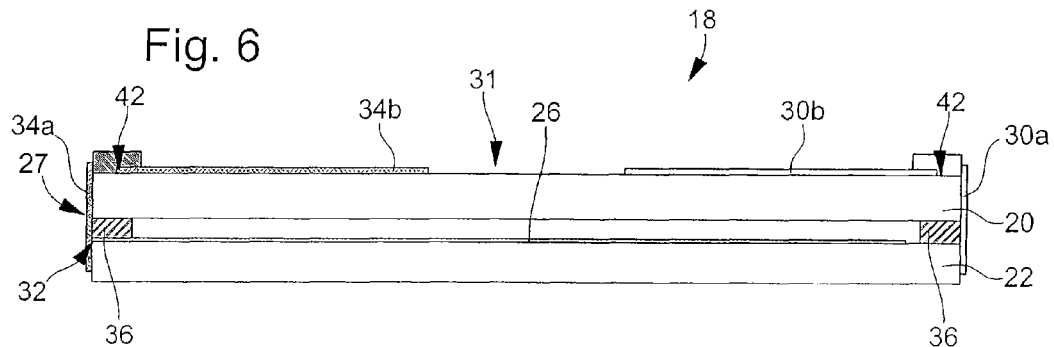
FIG. 6 is a cross-section of an alternative embodiment of the liquid crystal display cell shown in FIG. 5.

According to a variant of the present invention shown in FIG. 6, the second parts 30b, 34b of conductive paths 30 and 34 extend at least partially underneath conductive bumps 42.

Figure 7:
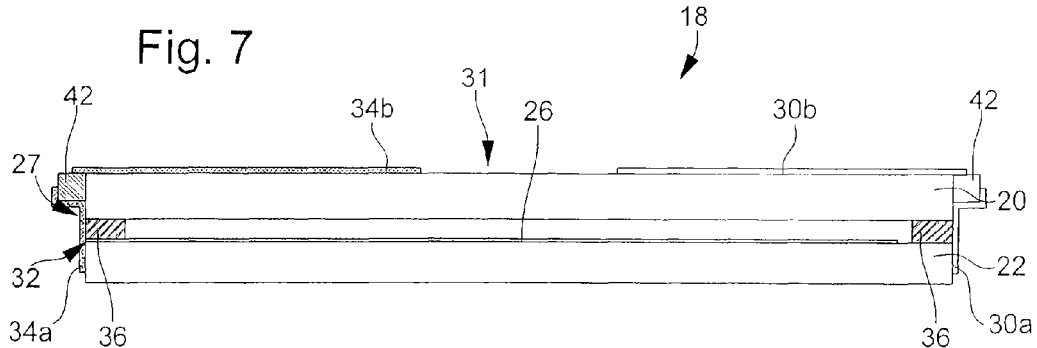
FIG. 7 is a cross-section of another variant of the liquid crystal display cell shown in FIG. 5.

According to another variant of the present invention shown in FIG. 7, at least some of bumps 42 can be arranged on edge 27 of cell 18.

As shown in FIGS. 5, 6 and 7, the contact means 42 has a thickness (i.e., the measure of the smallest dimension of the solid contact means 42), and the first parts 30a, 34a of the conductive paths 30, 34 are separate component parts of the conductive paths that contact the contact means 42. The thickness (i.e., the measure of the smallest dimension of the solid first parts 30a, 34a) of the first parts 30a, 34a is substantially less than the thickness of the contact means 42. As also shown in FIGS. 5, 6 and 7, the second parts 30b, 34b of the conductive paths 30, 34 are separate component parts of the conductive paths that also contact the contact means 42. The thickness (i.e., the measure of the smallest dimension of the solid second parts 30b, 34b) of the second parts 30b, 34b is substantially less than the thickness of the contact means 42. Consequently, the thickness of the contact means 42 is thicker than the thicknesses of the first part 30a, 34a and of the second part 30b, 34b of the conductive paths 30, 34 as shown in FIGS. 5, 6 and 7.

Figure 8:
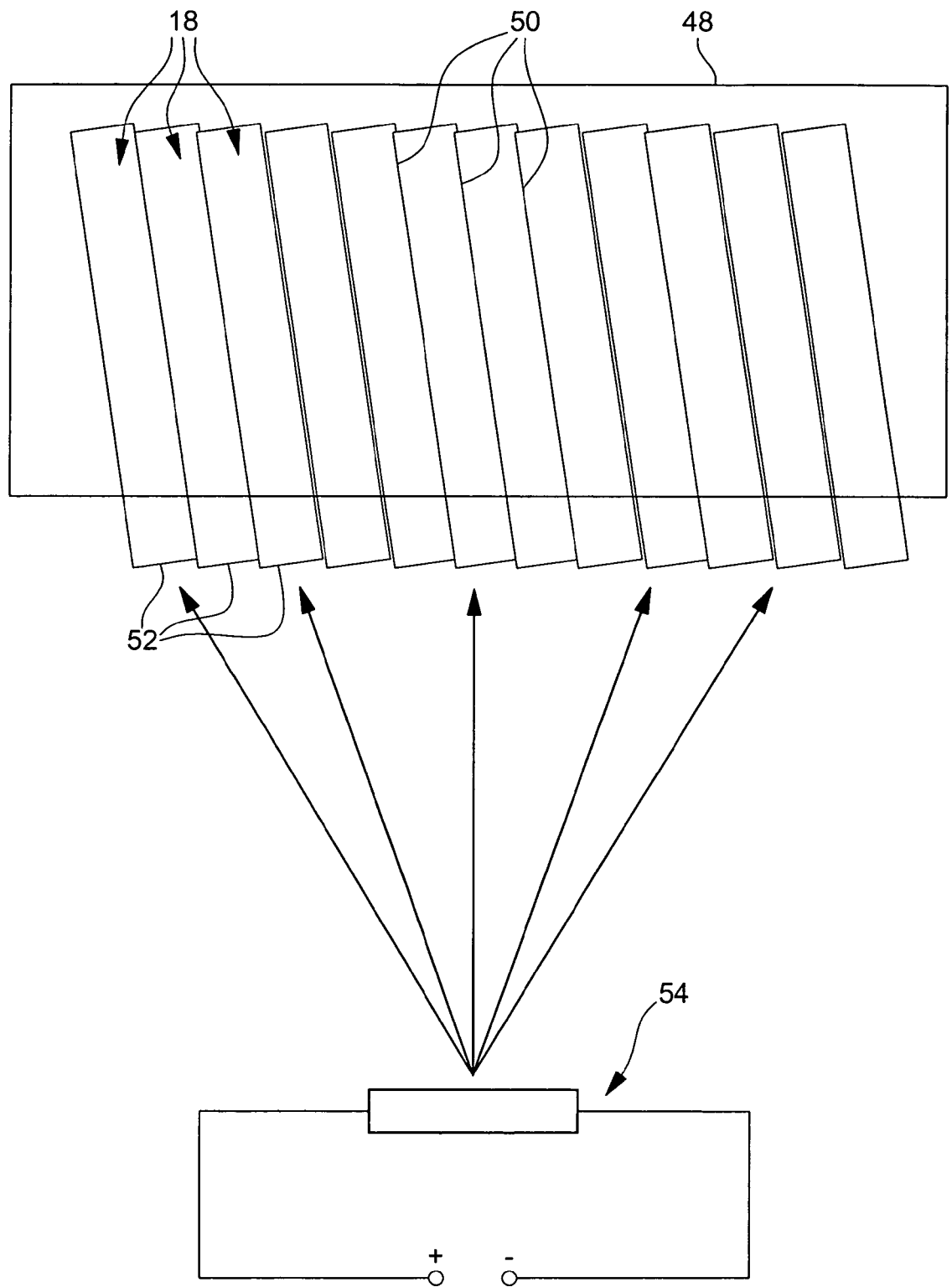
FIG. 8 is a schematic view illustrating the method of metallising a liquid crystal cell according to the invention.

In order to form the conductive paths which allow the electrical contacts formed by the electrodes of one cell to be moved to the back of the latter, one proceeds as follows. A fine layer of conductive material is evaporated onto the back of the cells while the latter are still in a batch. After the cells have been separated, a group of them is arranged on a support or fitting 48 (see FIG. 8). The cells are arranged parallel to each other obliquely and slightly staggered in relation to each other, such that their large sides 50 are parallel and their small sides 52 which will be metallized are arranged in a staggered staircase. An evaporation source 54 of an electrically conductive material is arranged facing fitting 48, opposite edges 52 of the cells to be metallized.

After back 31 and edge 27 of the cells have been metallized, the conductive paths have to be structured, for example by laser ablation. For the sake of economy and in order to obtain a better yield, only first parts 30a, 34a of conductive paths 30, 34 which extends over edge 27 of liquid crystal cells 18 will be structured by laser ablation, whereas second parts 30b, 34b of the same conductive paths 30, 34 which extend to back 31 of cells 18 will be structured by conventional photolithographic techniques.

Figure 9:
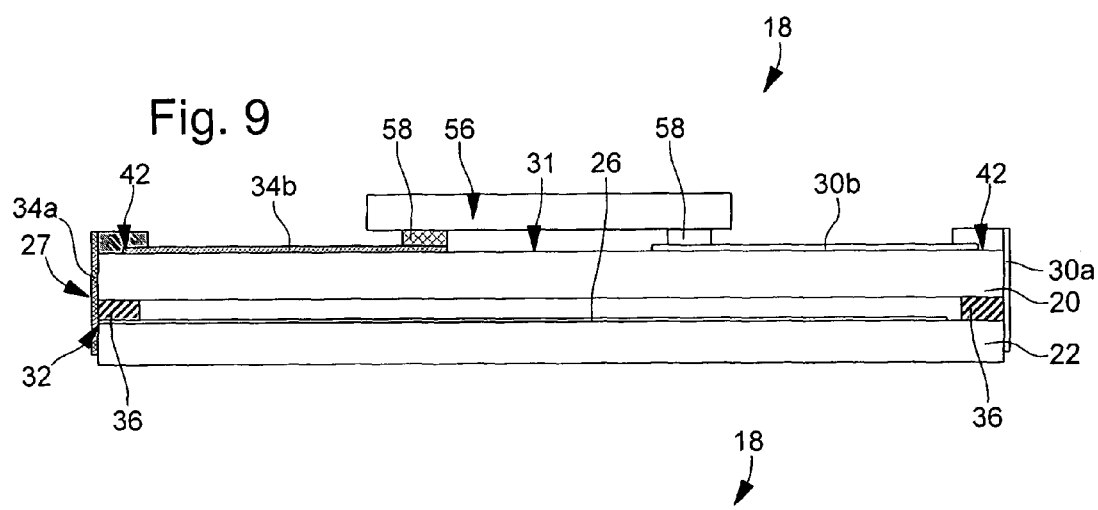
FIG. 9 is a cross-section of a liquid crystal cell according to the invention on the back of which a control circuit has been directly mounted.

Reference will now be made to FIG. 9 in which it can be seen that an integrated display control circuit 56 is mounted directly on back 31 of display cell 18. In the example shown in the drawing, integrated circuit 56 is flip chip bonded on display cell 18, such that its input ports 58 are bonded onto conductive paths 30, 34 of cell 18. Of course, according to a variant, input ports 58 of integrated circuit 56 could be connected to conductive paths 30, 34 by fine conductive wires, or wire bonding.

Thus, owing to these features, all of the operations for securing the integrated display control circuit occur in the same working plane, namely the back face 31 of the display cell, which considerably simplifies the manufacture of such an assembly. It will be noted, moreover, that display cell 18 provides control circuit 56 with a very stable mechanical support. It will be noted finally that, owing to the invention, it is possible to use only one integrated circuit to control both the line and column electrodes.

Figure 10:
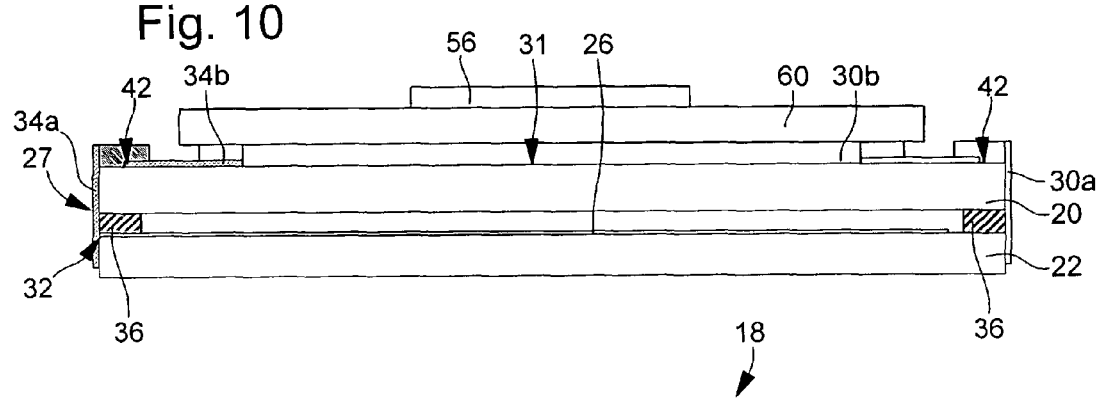
FIG. 10 is a similar view to that of FIG. 8, the control circuit being mounted on the back of the cell by means of a printed circuit board.

According to a variant of the invention shown in FIG. 10, integrated control circuit 56 is mounted on the back 31 of liquid crystal display cell 18 not directly, but via a printed circuit board 60.

Figure 11:
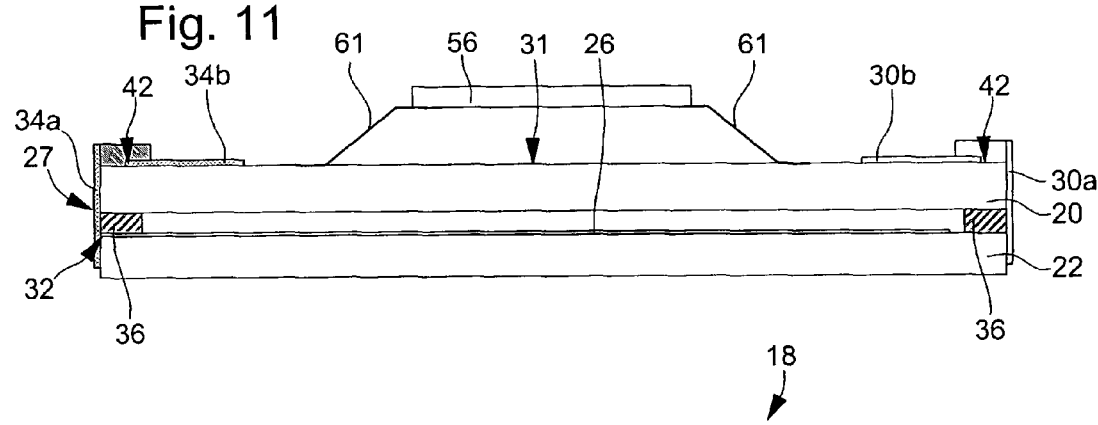
FIG. 11 is a similar view to that of FIG. 8, the control circuit being mounted on the back of the cell by means of a flexible conductive film.

According to yet another variant of the invention shown in FIG. 11, the integrated control circuit 56 is mounted on the back 31 of liquid crystal display cell 18 via a flexible conductive film 61 made of Kapton®, a technique known as tape automatic bonding or TAB.

Figure 12:
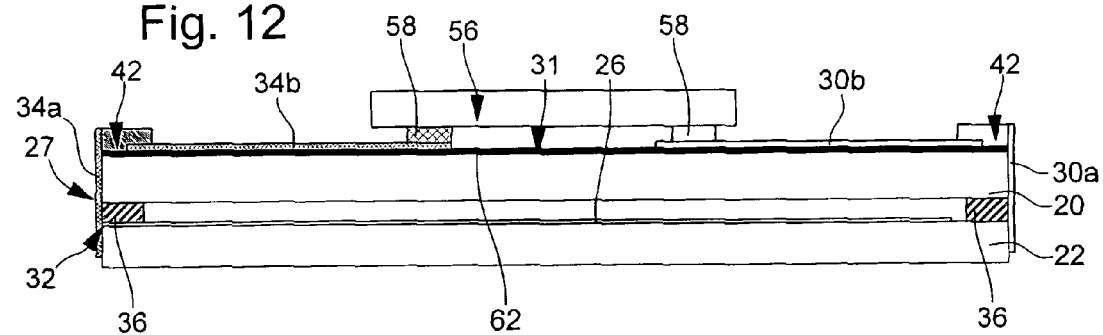
FIG. 12 is a similar view to that of FIG. 9, an absorbent stress relaxation layer having been deposited on the back face of the cell.

It goes without saying that the present invention is not limited to the embodiments that have just been described and that various simple alterations and variants can be envisaged without departing from the scope of the present invention. In particular, one could envisage (see FIG. 12) depositing, on the back of the liquid crystal cell, a transparent or coloured absorbent layer 62, whose functions would be as follows:
    absorbing the light transmitted through the liquid crystal cell;
    acting as a relaxation layer for the thermo-mechanical stresses which appear between the glass back substrate and the conductive paths during high temperature assembly of the control circuit on the back substrate;
    protecting the cell, and in particular the liquid crystal, from radiation by the laser beam during structuring of the metallic paths.

The absorbent layer should also be able to resist chemical etching baths when the metallic layer is etched on the back of the cell.

Figure 13:
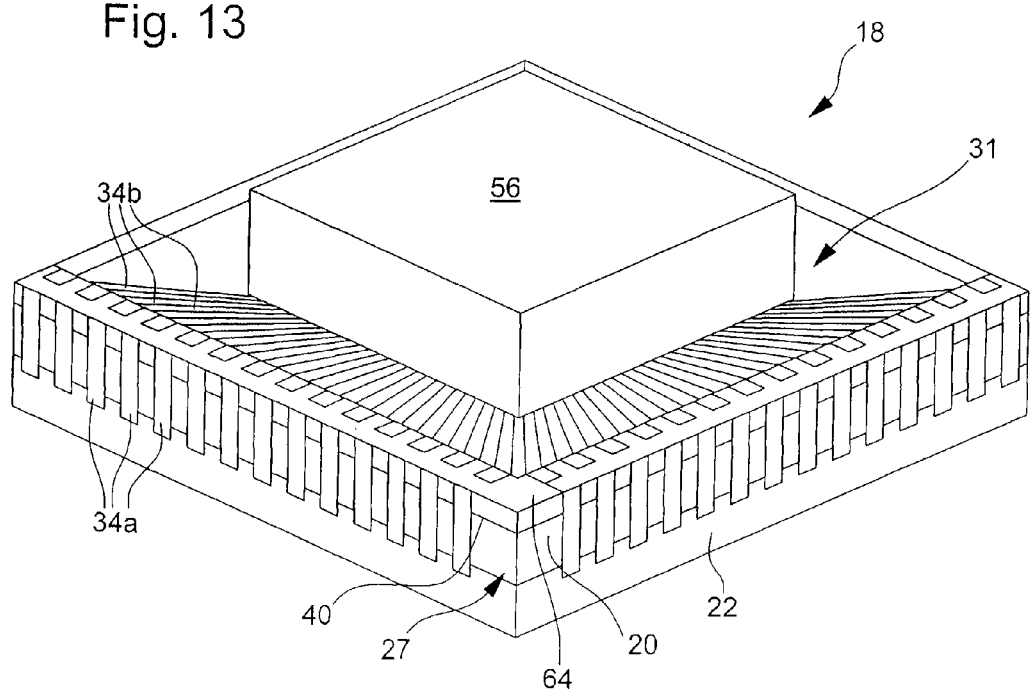
FIG. 13 is a perspective view of a liquid crystal cell provided with a strip of anisotropic conductive material forming the junction between the first and second parts of the conductive paths.

One could also envisage (see FIG. 13) replacing the individual conductive bumps by a tape of anistropic conductive material 64, which would only lead the current along direction of the depth of the tape, i.e. from back edge 40 of cell 18 towards the centre of the latter and not transversely, to avoid any risk of short-circuiting two adjacent conductive paths.

The invention claimed is:

1. An electro-optical display cell comprising:
   (a) at least one transparent front substrate whose top surface forms a front face of the cell;
   (b) at least one back substrate that may also be transparent or not, whose lower surface forms a back face of said cell;
   (c) a sealing frame joining the front and back substrates and defining a volume for retaining an electro-optically or photo-electrically active medium in a sealed manner, wherein
   said front and back substrates include on faces opposite each other at least one electrode each, these electrodes being connectable by conductive paths of the cell to an electrical power or control circuit and the electrodes are even or level with an edge surface of the front substrate and with an edge surface of the back substrate, respectively, and define lateral electric contact zones,
   wherein the conductive paths are each formed of a first separate component part in contact with the electrodes at the level of the lateral electric contact zones, and a second separate component part extending over the back surface of the cell; and
   (d) a contact member arranged over an edge, or back, or the edge and the back, of the cell thereby forming an electrical junction disposed between the first separate component part and the second separate component part of each conductive path, wherein the electric junction provides direct conductive continuity between the first separate component part and the second separate component part, and the first separate component part and the second separate component part are disposed so that each contacts the contact member.

2. The cell according to claim 1, wherein the contact member takes the form of discrete conductive bumps.

3. The cell according to claim 2, wherein the first separate component part of each conductive path comes into lateral contact with the conductive bumps, whereas the second separate component part of each conductive path can extend as far as the top of said bumps and cover said bumps in whole or in part.

4. The cell according to claim 2, wherein the second separate component part of each conductive path extends at least partially underneath the conductive bumps.

5. The cell according to claim 1, wherein the contact member takes the form of a tape of anisotropic conductive material.

6. The cell according to claim 1, wherein the cell includes a stack of (n) individual cells, each of the individual cells being defined by two substrates belonging thereto.

7. The cell according to claim 1, wherein the cell includes (n+1) superposed substrates, these (n+1) substrates being joined in pairs by a sealing frame.

8. A multi-layered liquid crystal display cell including:
   four superposed substrates joined in pairs by sealing frames which each define a sealed cavity for retaining liquid crystals;
   a first sealing frame joining the substrates, while a second sealing frame joins the substrates and a third sealing frame joins the substrates, said substrates including on faces opposite each other at least one electrode each, said electrodes being connectable by conductive paths to an electric control circuit and the electrodes are even or level with an edge surface of the front substrate and with an edge surface of the back substrate, respectively, and define lateral electric contact zones,
   wherein the conductive paths are each made up of a first separate component part in contact with the electrodes at the level of the lateral electric contact zones, and a second separate component part extending over a back surface of the cell; and
   a contact member arranged on an edge, or on back, or on the edge and on the back, of said cell thereby forming an electric junction disposed between the first separate component part and the second separate component part of each conductive path, wherein the electric junction provides direct conductive continuity between the first separate component part and the second separate component part, and the first separate component part and the second separate component part are disposed so that each contacts the contact member.

9. The cell according to claim 1, wherein a power circuit or the control circuit is mounted on the back of the cell.

10. The cell according to claim 8, wherein a power circuit or the control circuit is mounted on the back of the cell.

11. The cell according to claim 9, wherein the circuit is mounted directly on the back of the cell.

12. The cell according to claim 10, wherein the circuit is mounted directly on the back of the cell.

13. The cell according to claim 9, wherein the circuit is mounted on the back of the cell via a printed circuit board or a flexible conductive film.

14. The cell according to claim 10, wherein the circuit is mounted on the back of the cell via a printed circuit board or a flexible conductive film.

15. The cell according to claim 1, wherein a transparent or coloured absorbent layer for relaxing thermo-mechanical stresses and able to resist a chemical etch bath is deposited on the back of the cell.

16. The cell according to claim 8, wherein a transparent or coloured absorbent layer for relaxing thermo-mechanical stresses and able to resist a chemical etch bath is deposited on the back of the cell.

17. The cell according to claim 1, wherein the cell is a liquid crystal cell.

18. The cell according to claim 1, wherein the cell is an electrochemical photovoltaic cell.

19. The cell according to claim 1, wherein the contact member is disposed on an exterior surface of the cell.

20. The cell according to claim 8, wherein the contact member is disposed on an exterior surface of the cell.

21. The cell according to claim 1, wherein the back substrate is disposed between the contact member and the front substrate of the cell.

22. The cell according to claim 8, wherein the back substrate is disposed between the contact member and the front substrate of the cell.

23. The cell according to claim 1, wherein the contact member is disposed on a side of the cell.

24. The cell according to claim 8, wherein the contact member is disposed on a side of the cell.

25. The cell according to claim 1, wherein the contact member has a first thickness and the first separate component part has a second thickness and the second separate component part has a third thickness, wherein the first thickness is thicker than the second thickness and the first thickness is thicker than the third thickness.

26. The cell according to claim 8, wherein the contact member has a first thickness and the first separate component part has a second thickness and the second separate component part has a third thickness, wherein the first thickness is thicker than the second thickness and the first thickness is thicker than the third thickness.

\* \* \* \* \*